(12) United States Patent
Swernofsky et al.

(10) Patent No.: US 9,923,293 B2
(45) Date of Patent: Mar. 20, 2018

(54) RADIALLY COMPLIANT, AXIALLY FREE-RUNNING CONNECTOR

(71) Applicant: Raytheon Company, Waltham, MA (US)

(72) Inventors: David E. Swernofsky, Richardson, TX (US); Brandon W. Pillans, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/171,636

(22) Filed: Jun. 2, 2016

(65) Prior Publication Data

US 2017/0352969 A1  Dec. 7, 2017

(51) Int. Cl.
| | |
|---|---|
| H01R 24/00 | (2011.01) |
| H01R 12/75 | (2011.01) |
| H05K 1/02 | (2006.01) |
| H05K 3/30 | (2006.01) |

(52) U.S. Cl.
CPC ........... *H01R 12/75* (2013.01); *H05K 1/0243* (2013.01); *H05K 3/301* (2013.01); *H05K 2201/10303* (2013.01)

(58) Field of Classification Search
CPC ......... H05K 2201/10303; H05K 3/301; H05K 1/0243; H01R 12/75
USPC ............................... 439/63, 581, 74, 675, 86
See application file for complete search history.

(56) References Cited

U.S. PATENT DOCUMENTS

| | | | |
|---|---|---|---|
| 3,278,890 A * | 10/1966 | Cooney | H01R 13/187 174/75 R |
| 3,792,412 A | 2/1974 | Madden | |
| 4,097,101 A | 6/1978 | Holt et al. | |
| 5,120,258 A * | 6/1992 | Carlton | H01R 24/50 439/581 |
| 5,380,212 A * | 1/1995 | Smeenge, Jr. | H01R 13/2414 439/86 |
| 5,525,075 A * | 6/1996 | Michisita | H01P 5/085 439/581 |
| 5,928,000 A | 7/1999 | Rudisill et al. | |
| 6,166,615 A | 12/2000 | Winslow et al. | |
| 6,410,415 B1 * | 6/2002 | Estes | H01L 21/563 257/778 |
| 6,780,057 B2 * | 8/2004 | Figueroa | H05K 7/1061 439/607.36 |
| 6,790,051 B1 * | 9/2004 | Secall | H01R 13/5202 174/260 |

(Continued)

FOREIGN PATENT DOCUMENTS

| | | |
|---|---|---|
| WO | 1990014750 A1 | 11/1990 |
| WO | 1997009753 A1 | 3/1997 |
| WO | 2007109608 A2 | 9/2007 |

OTHER PUBLICATIONS

ISO/WO, dated Aug. 22, 2017, Application No. PCT/US2017/033329, 11 pages.

*Primary Examiner* — Abdullah Riyami
*Assistant Examiner* — Nelson R Burgos-Guntin
(74) *Attorney, Agent, or Firm* — Cantor Colburn LLP (57) ABSTRACT

A connectable assembly is provided and includes a body defining a recess, a male conductive element supportively disposed proximate to the body and a conductive compliant (CC) plug disposed within the recess for establishing a radially compliant, axially free running electrical connection with the male conductive element.

26 Claims, 8 Drawing Sheets

(56) References Cited

U.S. PATENT DOCUMENTS

| | | | |
|---|---|---|---|
| 6,924,654 B2* | 8/2005 | Karavakis | G01R 1/0483 |
| | | | 324/756.03 |
| 6,946,859 B2* | 9/2005 | Karavakis | G01R 1/0483 |
| | | | 324/754.18 |
| 7,097,499 B1 | 8/2006 | Purdy | |
| 7,960,214 B2* | 6/2011 | Shen | H01L 24/16 |
| | | | 257/E21.503 |
| 2001/0016435 A1 | 8/2001 | Fujimura | |
| 2004/0009686 A1 | 1/2004 | Liu | |
| 2004/0053519 A1* | 3/2004 | Li | H01R 13/2414 |
| | | | 439/63 |
| 2004/0180561 A1* | 9/2004 | Nguyen | G01R 1/0483 |
| | | | 439/74 |
| 2006/0057781 A1 | 3/2006 | Shiffer | |
| 2011/0008974 A1* | 1/2011 | Salomie | G06F 17/5068 |
| | | | 439/55 |
| 2013/0163725 A1* | 6/2013 | Hansen | H01R 13/53 |
| | | | 378/101 |
| 2014/0187073 A1* | 7/2014 | Tiberghien | H01R 13/625 |
| | | | 439/311 |
| 2015/0111399 A1* | 4/2015 | Karls | H01R 13/6205 |
| | | | 439/39 |
| 2016/0181729 A1* | 6/2016 | Barth | A41D 1/005 |
| | | | 439/37 |

* cited by examiner

RADIALLY COMPLIANT, AXIALLY FREE-RUNNING CONNECTOR

BACKGROUND

The present disclosure relates to electrical and radio frequency (RF) connectors and, more particularly, to radially complaint, axially free-running electrical and RF connectors.

In electronics, radio frequency (RF) connectors are often used to transmit one or more signals from one circuit board to another and can be provided in arrays of hundreds of connectors per square inch of circuit board area. This need for small-pitch RF connector configurations is only increasing and leads to large increases in costs of RF connector assemblies or to RF connector assemblies that cannot be easily disassembled for service and repair.

SUMMARY

According to one embodiment, a connectable assembly is provided and includes a body defining a recess, a male conductive element supportively disposed proximate to the body and a conductive compliant (CC) plug disposed within the recess for establishing a radially compliant, axially free running electrical connection with the male conductive element.

According to another embodiment, a connectable assembly is provided and includes a first body with first circuitry, a second body with second circuitry formed to define a recess, a pin connector affixed to the first body in electrical connection with the first circuitry and a conductive compliant (CC) plug. The CC plug is disposed within the recess in electrical connection with the second circuitry for establishing a radially compliant, axially free running electrical connection with the pin connector.

According to another embodiment, a method of assembling, disassembling and re-assembling a connector assembly is provided. The method includes inserting a pin connector into a conductive compliant (CC) plug to establish a radially compliant, axially free running electrical connection between the pin connector and the CC plug, withdrawing the pin connector from the CC plug and re-inserting the pin connector into the CC plug to re-establish the radially compliant, axially free running electrical connection between the pin connector and the CC plug.

According to another embodiment, a connectable assembly is provided and includes a first body with first circuitry and being formed to define a first recess, a second body with second circuitry and formed to define a second recess, an intermediate carrier interposable between the first and second bodies and including first and second sides and first and second pin connectors affixed to the first and second sides, respectively, and first and second conductive compliant (CC) plugs. The first and second CC plugs are disposed within the first and second recesses in electrical connection with the first and second circuitry, respectively, for radially compliant, axially free running electrical connections with the first and second pin connectors, respectively.

According to yet another embodiment, a connectable assembly is provided for a coaxial cable having inner and outer conductors. The connectable assembly includes a first body that itself includes first and second circuitry and defines a recess, a second body that includes electrically conductive elements and defines a first through-hole receptive of the coaxial cable such that the electrically conductive elements electrically connect with the outer conductor, an interposer element interposable between the first and second bodies to form an electrically conductive pathway from the electrically conductive elements to the second circuitry and a conductive compliant (CC) plug. The CC plug is disposable within the recess in electrical connection with the first circuitry for establishing a radially compliant, axially free running electrical connection with the inner conductor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a conductive or semi-conductive compliant (CC) plug (as used herein the term "conductive" will be used to encompass both conductive and semi-conductive applications) is provided in a connectable assembly to receive a metal pin for the creation of an electrical connection. When the pin is inserted or stabbed into the CC plug, radial compression of the CC creates a reliable electrical connection while insertion depth of the pin can vary greatly without compromising the structural integrity of the CC plug and the electrical connection. This provides for a large range of axial compliance and permits electrical connections to be made over a large range of insertion depth variations. Using the CC plugs and pins provides for spacing of multiple CC plugs and pins that is as small as printed wiring board (PWB) or semi-conductor technology allows and means that insertion forces can be configured and will be substantially constant over a large range of insertion depths. Connectable assemblies employing the CC plugs and pins will be able to be assembled and dis-assembled simply by way of alignment and pressing actions with radial compliance of the CC plugs allowing for certain radial misalignments. Such resulting connectable assemblies may have radio frequency (RF), direct current (DC) or alternating current (AC) signal connections as well as DC or AC power connections that are potentially all handled by same configurations thus permitting multi-mode connections.

Figure 1:
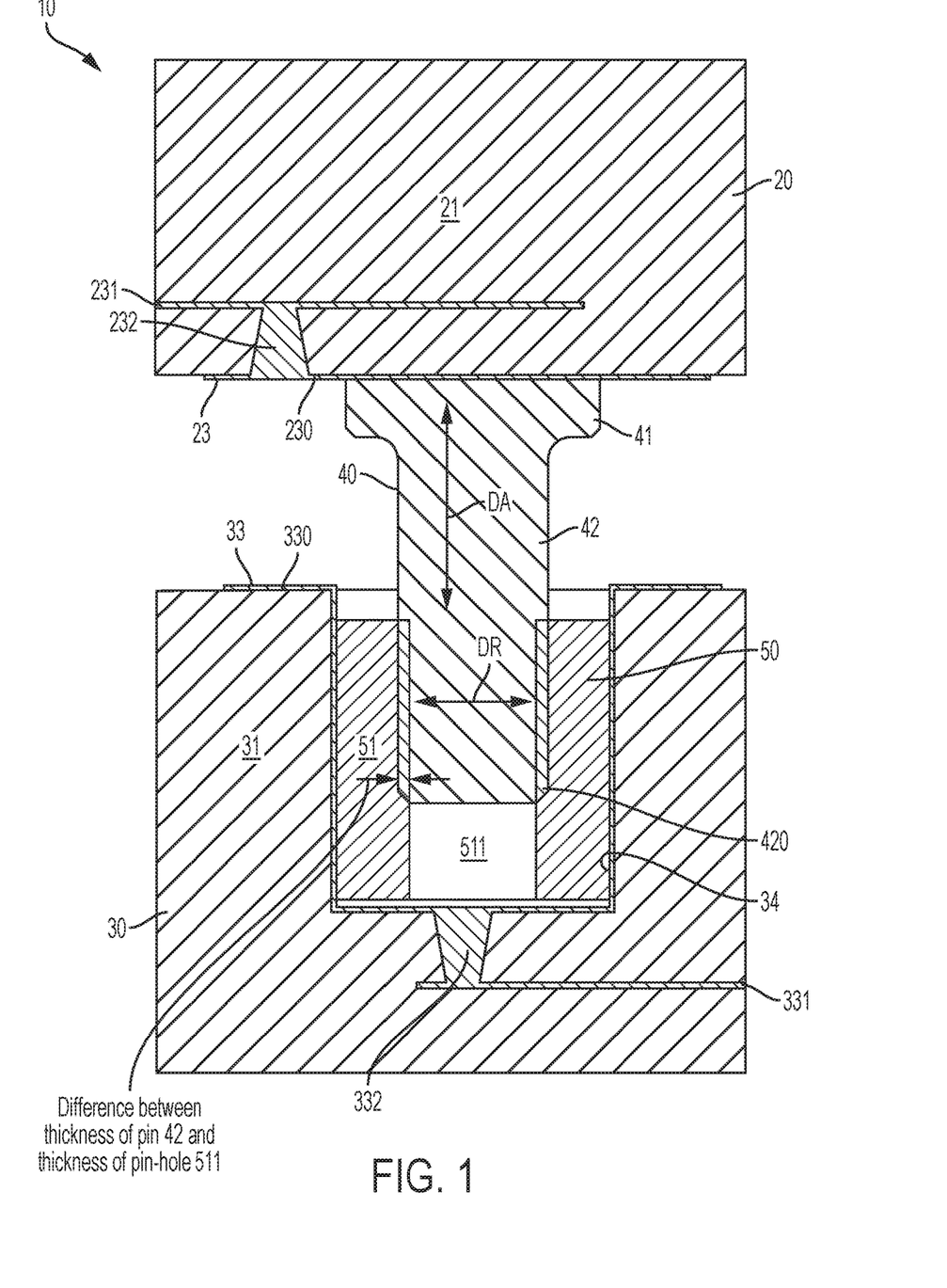
FIG. 1 is a side view of a connectable assembly in accordance with embodiments.
Figure 2:
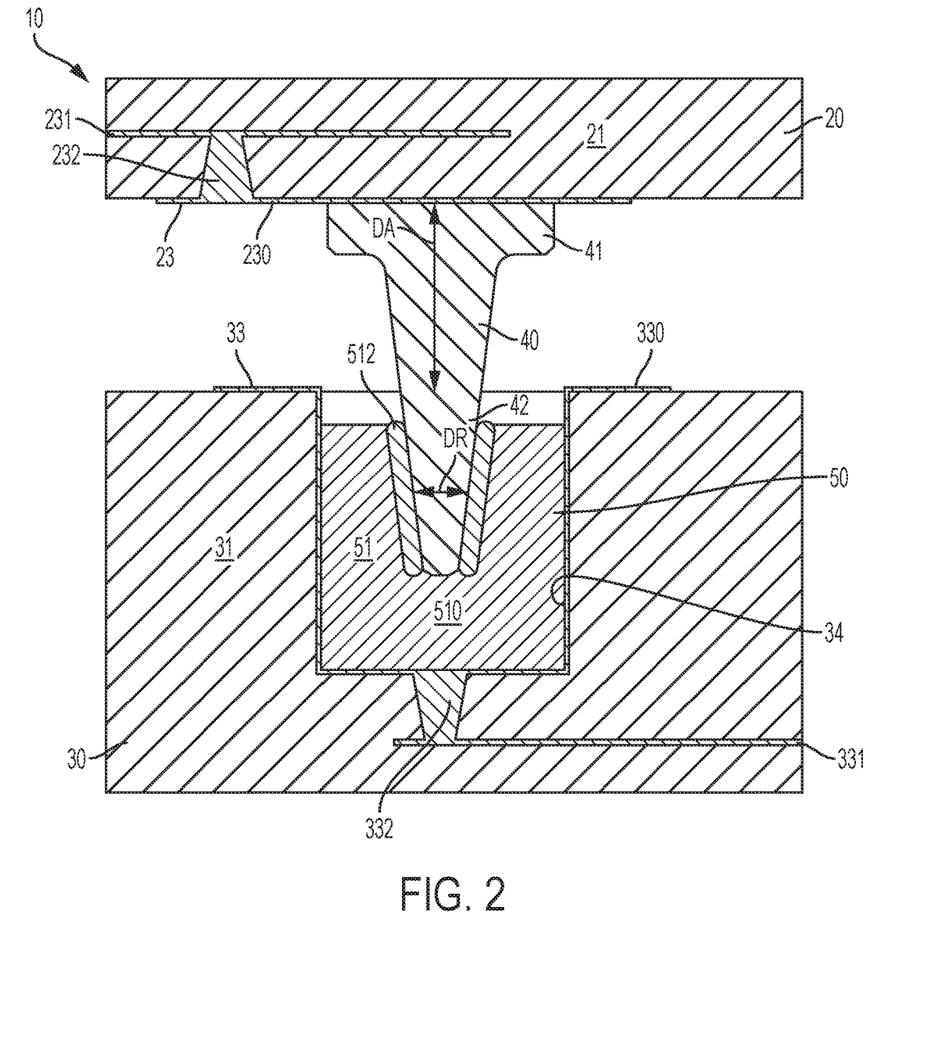
FIG. 2 is a side view of a connectable assembly in accordance with alternative embodiments.
Figure 3:
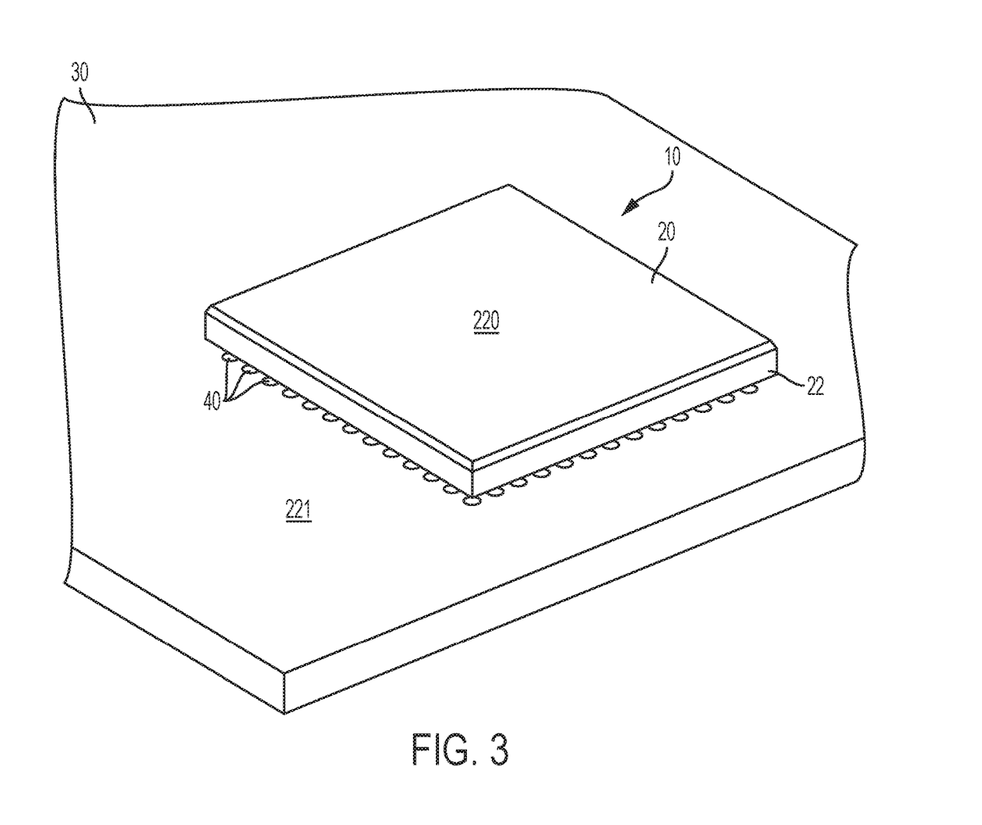
FIG. 3 is a perspective view of a chip package assembly in accordance with embodiments.

With reference to FIGS. 1-3, a connectable assembly 10 is provided and includes a first body 20, a second body 30, a male conductive element that may be provided in certain embodiments as a pin connector 40 and a conductive compliant (CC) plug 50. The first body 20 may be provided as a first circuit board 21, as shown in FIGS. 1 and 2, or as a chip package 22, as shown in FIG. 3. The second body 20 may be provided as a second circuit board 31, as shown in FIGS. 1 and 2, or potentially as a chip package.

In any case, the first body 20 may include first circuitry 23, such as first surface trace elements 230 that extend along an outer surface of the first body 20, first internal trace elements 231 that extend through a center of the first body 20 and first vias 232 by which the first surface trace elements 230 are electrically communicative with the first internal trace elements 231. The second body 30 may be provided as a second circuit board 31 or as a chip package and, in any case, may include second circuitry 33. This second circuitry 33 may include second surface trace elements 330 that extend along an outer surface of the second body 30, second internal trace elements 331 that extend through a center of the second body 30 and second vias 332 by which the second surface trace elements 330 are electrically communicative with the second internal trace elements 331.

The second body 30 is formed to define a recess 34 that extends into the second body 30 from the outer surface along which the second surface trace elements 330 extend. In accordance with embodiments, the recess 34 may have a substantially cylindrical or frusto-conical shape with an axial end wall that may be but is not required to be parallel with the outer surface of the second body 30 and sidewalls extending outwardly from the axial end wall to the outer surface.

The pin connector 40 may be affixed to the outer surface of the first body 20 along which the first surface trace elements 230 extend. In accordance with embodiments, the pin connector 40 may be entirely formed of electrically conductive materials and includes a base portion 41 and a pin 42 although it is to be understood that the base portion 41 need not be used and that the pin 42 could extend along an entire length of the pin connector 40. Where it is used, the base portion 41 can be soldered to the first body 20 to form an electrical connection with the first surface trace elements 230 of the first circuitry 23. The pin 42 may be integrally connected to an axial face of the base portion 41 and extends axially outwardly away from the axial face. A diameter or width of the base portion 41 may exceed that of the pin 42 whereas an axial length of the pin 42 may exceed an axial length of the base portion 41. Where no base portion 41 is provided, the pin 42 can be attached, soldered or otherwise connected to the first body 20 directly.

The CC plug 50 is disposable within the recess 34 and includes a plug body 51 that is formed of one or more conductive compliant polymeric materials, conductive compliant foamed metallic materials and conductive compliant foamed plastic materials. The conductive compliant materials may be compliant up to a certain degree beyond which they are subject to compressive failure. In any case, with the CC plug 50 disposed within the recess 34, the CC plug 50 is disposed in electrical connection with either or both of the second surface trace elements 330 and the second internal trace elements 332 of the second circuitry 33.

In accordance with embodiments, the CC plug 50 may have, but is not required to have, a similar shape as the recess 34. Thus, if the recess 34 is substantially cylindrical, the CC plug 50 may also be substantially cylindrical. In such cases, however, the CC plug 50 may have a diameter or width in an uncompressed state that exceeds the diameter or width of the recess 34. Therefore, when the CC plug 50 is disposed in the recess 34, the electrical connection between the CC plug 50 and the second circuitry 33 can be reliably established due to radial compressive effects applied to the CC plug 50. Also, the radial compression of the CC plug 50 helps to retain the CC plug 50 in the recess 34 by frictional engagement with the sidewalls of the recess 34 and improves the reliability of the electrical connection between the pin connector 40 and the CC plug 50 to be described below.

Alternatively, disposition of the CC plug 50 into the recess 34 may be achieved by liquid dispensation of the CC plug material into the recess 34 and subsequent in situ curing of the CC plug material. In these or other cases, the resulting CC plug 50 may be at least partially secured within the recess 34 by surface adhesion.

The pin connector 40 and the recess 34 may be disposed in positional correspondence with one another. Thus, when the first and second bodies 20 and 30 are brought together as will be described below, the pin 42 is inserted into the plug body 51 of the CC plug 50 (i.e., into a pre-existing pin hole in the CC plug 50 or into the plug body 51 whereupon the pin 42 forms its own pin-hole) to generate and form a radially compliant, axially free running electrical connection between the pin connector 40 and the CC plug 50.

Whether the pin 42 is inserted into a pre-existing pin-hole or not, the pin 42 pushes radially outwardly against the conductive compliant material of the CC plug 50. Even where the CC plug 50 is radially compressed by the recess 34 in an inward radial direction, the radial outward pushing by the pin 42 does not compress the conductive compliant material of the CC plug 50 enough to cause the CC plug 50 to compressively fail in the radial direction DR (see FIGS. 1 and 2). The radial compression is sufficient, however, to encourage the reliable formation of the electrical connection between the pin 42 and the CC plug 50 such that an electrical pathway can be formed from the first circuitry 23 to the pin connector 40, from the pin connector 40 to the CC plug 50 and from the CC plug 50 to the second circuitry 33.

The pin 42 can be repeatedly inserted into, removed or withdrawn from and the re-inserted into the CC plug 50 without risking failure of the CC plug 50.

Since the insertion depth of the pin 42 can be (but does not need to be) controlled to a high degree of accuracy, compressive failure of the CC plug 50 in the axial direction can be prevented. That is, although some compressive forces may be applied to the CC plug 50 in the axial direction DA (see FIGS. 1 and 2) during initial penetration of the pin 42, those axially compressive forces are virtually maximized once the pin 42 completes the initial penetration of the CC plug 50 (aside from negligible compressive forces arising from frictional engagement of the pin 42 and the CC plug 50 during continued insertion) and would not markedly increase unless and until the base portion 41 comes into contact with the CC plug 50 or the first and second bodies 20 and 30 come into contact with each other or a spacer (to be discussed below). In fact, such contact between the base portion 41 and the CC plug 50 is entirely preventable as will be discussed below.

Figure 4:
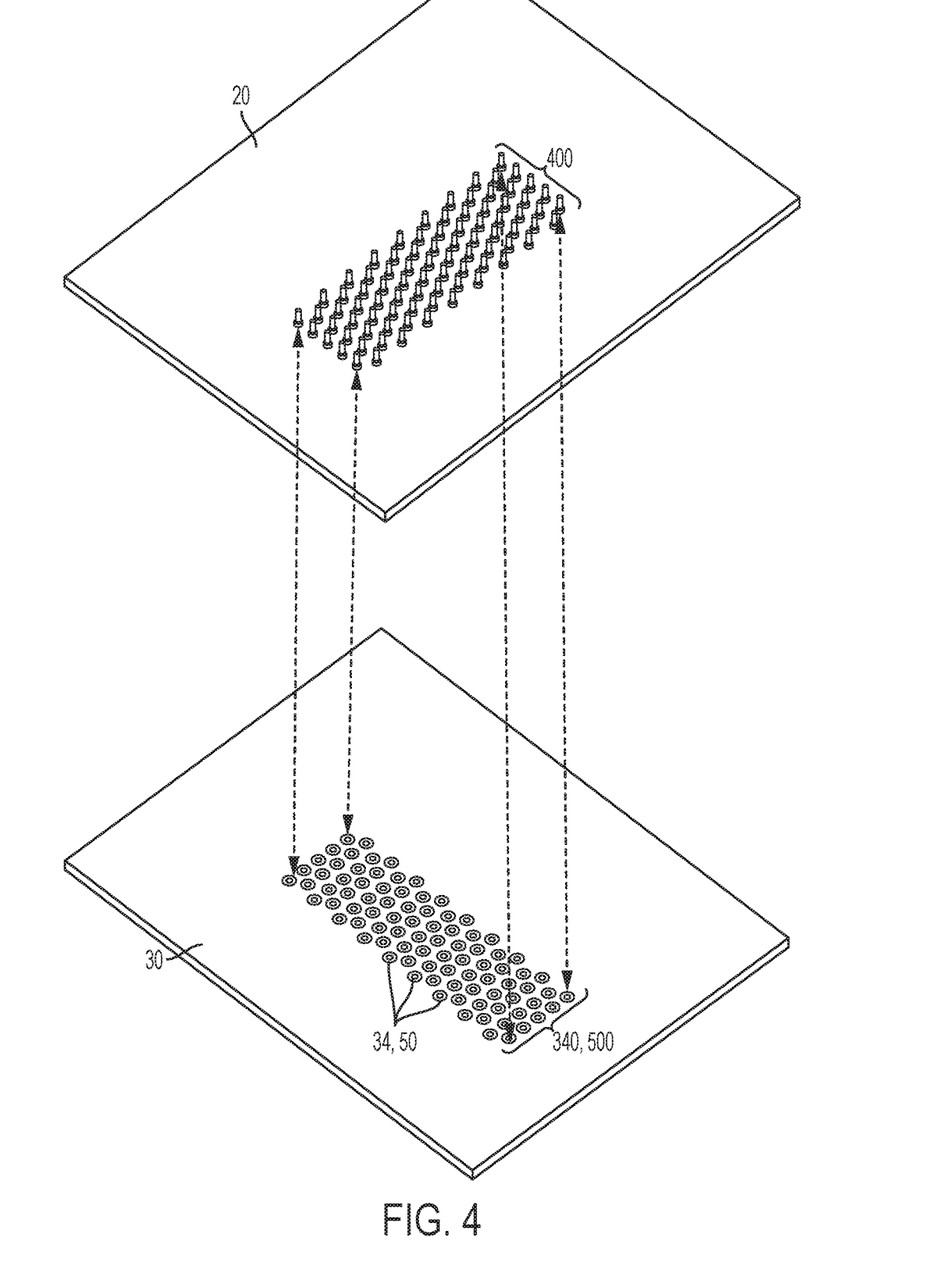
FIG. 4 is a perspective, exploded view of components of a connectable assembly in accordance with embodiments.

With reference to FIG. 4, the second body 30 may be formed to define multiple recesses 34 in an array 340 of recesses 34. In such cases, the pin connector 40 and the CC plug 50 may each be provided as a plurality of pin connectors 40 and a plurality of CC plugs 50, respectively. Such pluralities of pin connectors 40 and CC plugs 50 may be disposed in numerical and positional correspondence with the multiple recesses 34 such that the pin connectors 40 are provided in an array 400 of pin connectors 40, which corresponds to the array 340 of recesses 34, and such that the CC plugs 50 are provided in an array 500 of CC plugs 50, which corresponds to the array 340 of recesses. The pitch of the respective arrays 340, 400 and 500 may be as small as permitted by PWB or semi-conductor technology and as small as needed for specific applications (e.g., 200 or more connections per square inch).

Where the recesses 34, the pin connectors 40 and the CC plugs 50 are provided in the respective arrays 340, 400 and 500, assembly of the connectable assembly 10 involves the penetration of the plurality of the CC plug 50 by the pins 42 of each of the pin connectors 40. Such penetration may take place simultaneously such that the total force required to complete the penetration is a multiple of the force required to complete the penetration of a single CC plug 50 by a single pin 42. In accordance with embodiments, the CC plugs 50 can be configured such that this total force is limited to a predefined level.

In accordance with particular embodiments in which at least one of the first and second bodies 20 and 30 is provided as the chip package 22, as shown in FIG. 3, the respective arrays 340, 400 and 500 of the recesses 34, the pin connectors 40 and the CC plugs 50 may be provided in place of a land grid array (LGA) or a ball grid array (BGA). For example, the pin connectors 40 may be soldered to an underside of a chip element 220 (taking the place of the first body 20 described herein) with their respective pins 42 penetrating into corresponding CC plugs 50 of a circuit board 221 (taking the place of the second body 30 described herein). Assembly of such a chip package 22 could therefore be completed without need for soldering or associated thermal cycling.

Figure 5:
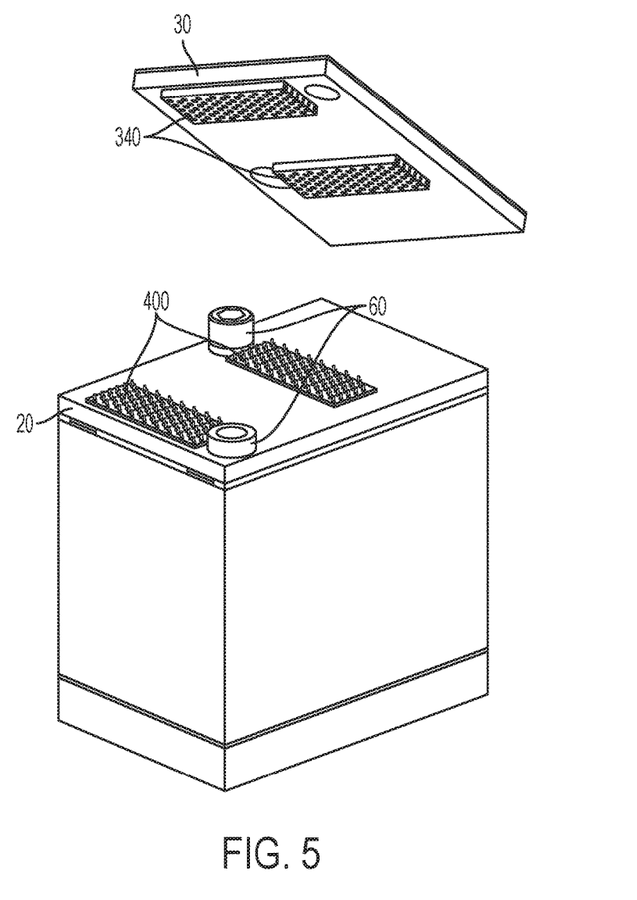
FIG. 5 is a perspective, exploded view of components of a connectable assembly and mounting hardware in accordance with embodiments.
Figure 6:
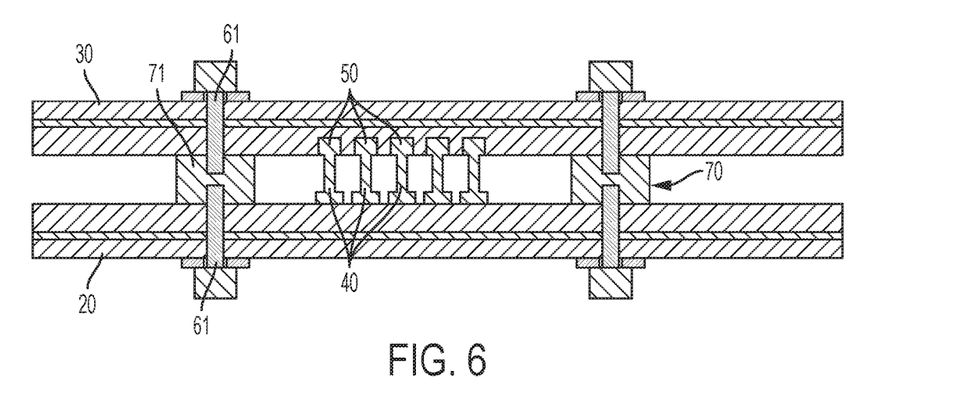
FIG. 6 is a side view of components of a connectable assembly, mounting hardware and spacers in accordance with embodiments.

With reference to FIGS. 5 and 6, the connectable assembly 10 may include mounting hardware 60 that is configured to secure the first and second bodies 20 and 30 together and spacers 70, which are spatially interposed between the first and second bodies 20 and 30 to insure that the CC plugs 50 are not axially compressed along the axial direction DA (see FIGS. 1 and 2) as a result of the first and second bodies 20 and 30 being brought together along the axial direction DA by an excessive distance. As shown in FIGS. 5 and 6, the mounting hardware 60 may be provided as screw elements 61 and the spacers 70 may be provided as spacer elements 71 where the screw elements 61 are rotatably drivable into the spacer elements 71 in order to draw the first body 20 toward the second body 30 in a tightening direction. The thickness of the spacer elements 71 may thus be provided such that the pins 42 of each of the pin connectors 40 penetrates into the CC plugs 50 by a given depth, which is less than the depth of the CC plugs 50 and the recesses 34.

As shown in FIG. 1, the pin 42 of each pin connector 40 may have a substantially uniform diameter or thickness along a longitudinal axis thereof as measured from the base portion 41 (or the first body 20). In such cases, the CC plug 50 can be formed as a solid body 510 without a pre-existing pin-hole or with a pre-existing pin-hole 511 defined in the plug body 51. In the former case, a first penetration of the pin 42 into the CC plug 50 serves to form and define a first pin-hole around the pin 42. Then, if the pin 42 is withdrawn from the CC plug 50, re-insertion of the pin 42 into the CC plug 50 can be provided such that the pin 42 re-enters the first pin-hole made during the first penetration or such that the pin 42 penetrates into the CC plug 50 at a new location whereupon the pin 42 forms and defines a second pin-hole around the pin 42. In the latter case, the pre-existing pin-hole 511 may be generally formed through a central portion of the plug body 51 and extends along a longitudinal axis of the plug body 51. The pin 42 may have a diameter or thickness that slightly exceeds the corresponding dimension of the pre-existing pin-hole 511 such that the plug body 51 is radially outwardly compressed by the pin 42 as the pin 42 penetrates through the CC plug 50 along the pin-hole 511.

The pin 42 may further include chamfered corners 420 at its distal end even where the pin 42 otherwise has a substantially uniform diameter or thickness. Such chamfered corners 420 will facilitate insertion of the pin 42 into the corresponding CC plug 50 and may provide centering assistance to such insertion processing.

As shown in FIG. 2, the pin 42 of each pin connector 40 may be tapered radially inwardly along a longitudinal axis thereof with increasing distance from the base portion 41 (or the first body 20). In such cases, the CC plug 50 can be formed as a solid body 510 without a pre-existing pin-hole or with a pre-existing pin-hole. In the former case, a first penetration of the pin 42 into the CC plug 50 serves to form and define a first pin-hole around the pin 42. Then, if the pin 42 is withdrawn from the CC plug 50, re-insertion of the pin 42 into the CC plug 50 can be provided such that the pin 42 re-enters the first pin-hole made during the first penetration or such that the pin 42 penetrates into the CC plug 50 at a new location whereupon the pin 42 forms and defines a second pin-hole around the pin 42. In any case, the penetration of the pin 42 into the CC plug 50 may form or result in compressively deformed wing sections 512 of the plug body 51 that extend along sides of the pin 42. The compressively deformed wing sections 512 exhibit increasing surface contact with the pin 42 owing to compressive deformation of the material of the CC plugs 50.

With the construction and configurations described above, a method of assembling, disassembling and re-assembling of the connectable assembly 10 is provided. The method includes inserting the pin 42 of a pin connector 40 into the plug body 51 of a CC plug 50 to establish a radially compliant, axially free running electrical connection, withdrawing the pin 42 of the pin connector 40 from the plug body 51 of the CC plug 50 and re-inserting the pin 42 of the pin connector 40 into the plug body 51 of the CC plug 50 to re-establish the radially compliant, axially free running electrical connection. The method may further include providing mounting hardware 60 by which the first and second bodies 20 and 30 can be secured together and interposing a spacer 70 between the first and second bodies 20 and 30 to maintain a predefined distance between the first and second bodies 20 and 30.

Thus, while conventional connectable assemblies cannot be easily assembled, disassembled and re-assembled or, if they are easily assembled, disassembled and re-assembled, they are too large, expensive and ill-suited for RF communications or a combination of RF and other signal communications, the methods described above can be repeated multiple times as needed for particular applications. It is expected that the CC plugs 50 will be sufficiently compliant to permit such repetitions and, to the extent that individual CC plugs 50 fail, those failed CC plugs 50 can be easily identified and replaced.

Figure 7:
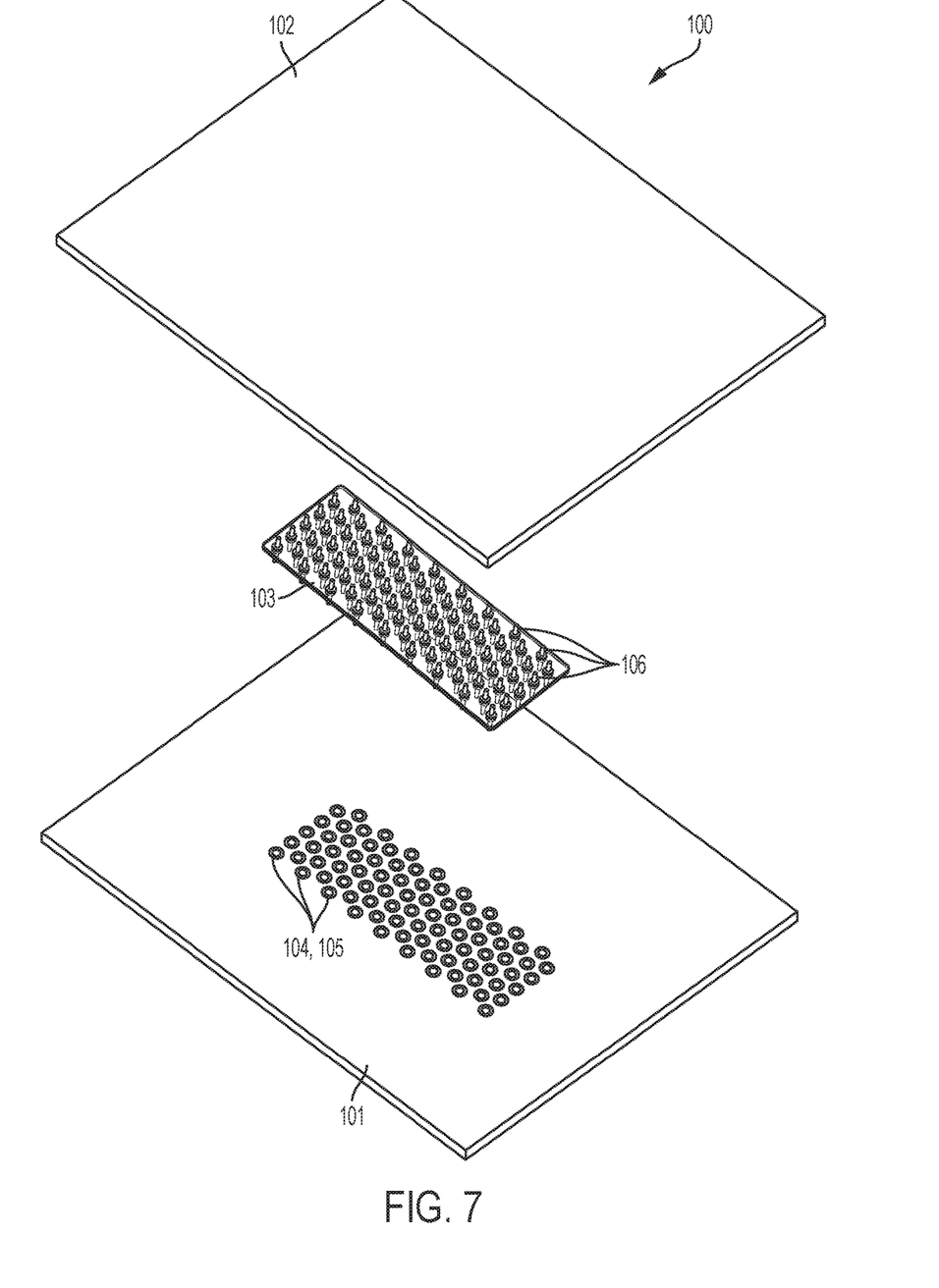
FIG. 7 is a perspective, exploded view of components of a connectable assembly in accordance with further embodiments.
Figure 8:
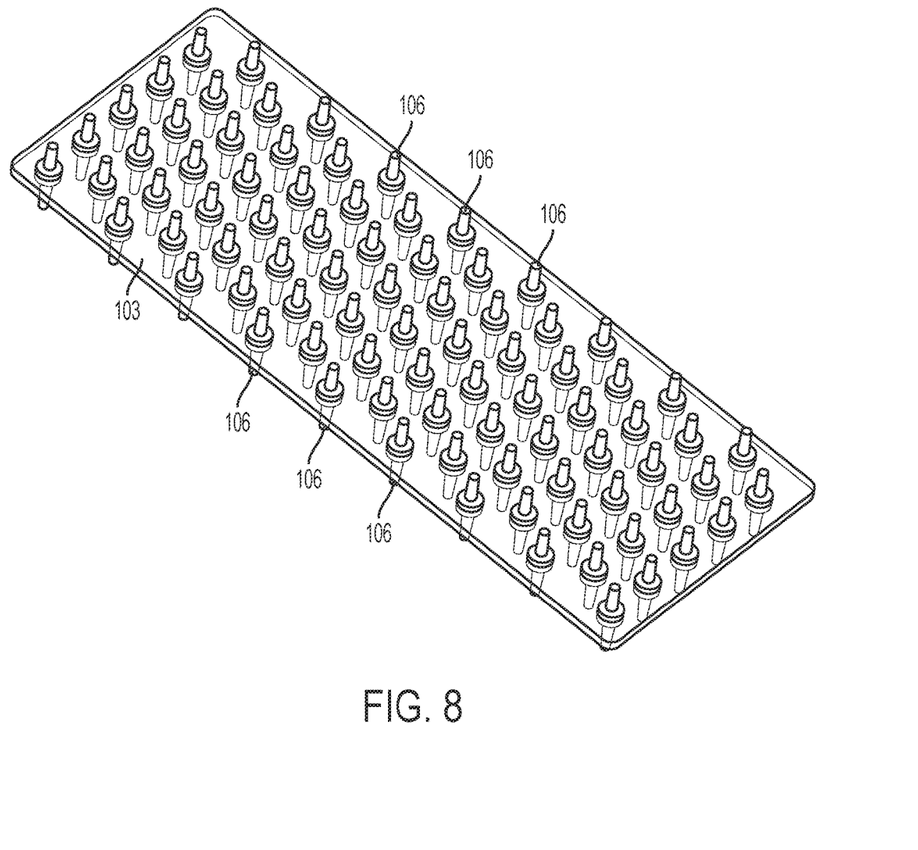
FIG. 8 is a perspective view of an intermediate carrier of the components of FIG. 7.

With reference to FIGS. 7 and 8, a connectable assembly 100 is provided and includes some features which are similar to those described above and thus need not be described in detail further below.

The connectable assembly 100 includes a first body 101, a second body 102, an intermediate carrier 103 and first and second CC plugs 104. As above, the first and second bodies 101 and 102 may be provided as circuit boards or as chip package elements. The first body 101 includes first circuitry and is formed to define first recesses 105 in which the first CC plugs 104 are disposable. The second body 102 includes second circuitry and is formed to define second recesses (not shown in FIG. 7 but essentially opposite from the first recesses 105) in which the second CC plugs are disposable. The intermediate carrier 103 is a planar body that is interposable between the first and second bodies 101 and 102. The intermediate carrier 103 includes first and second sides and male conductive elements that in these embodiments may be provided as first and second pin connectors 106 which are affixed to the first and second sides, respectively. The first and second CC plugs 104 are disposed within the first recesses 105 of the first body 101 and the second recesses of the second body 102 such that they are disposed in electrical connection with the first and second circuitry, respectively. The first and second CC plugs 104 are therefore configured for establishing radially compliant, axially free running electrical connections with the first and second pin connectors 106, respectively.

Figure 9:
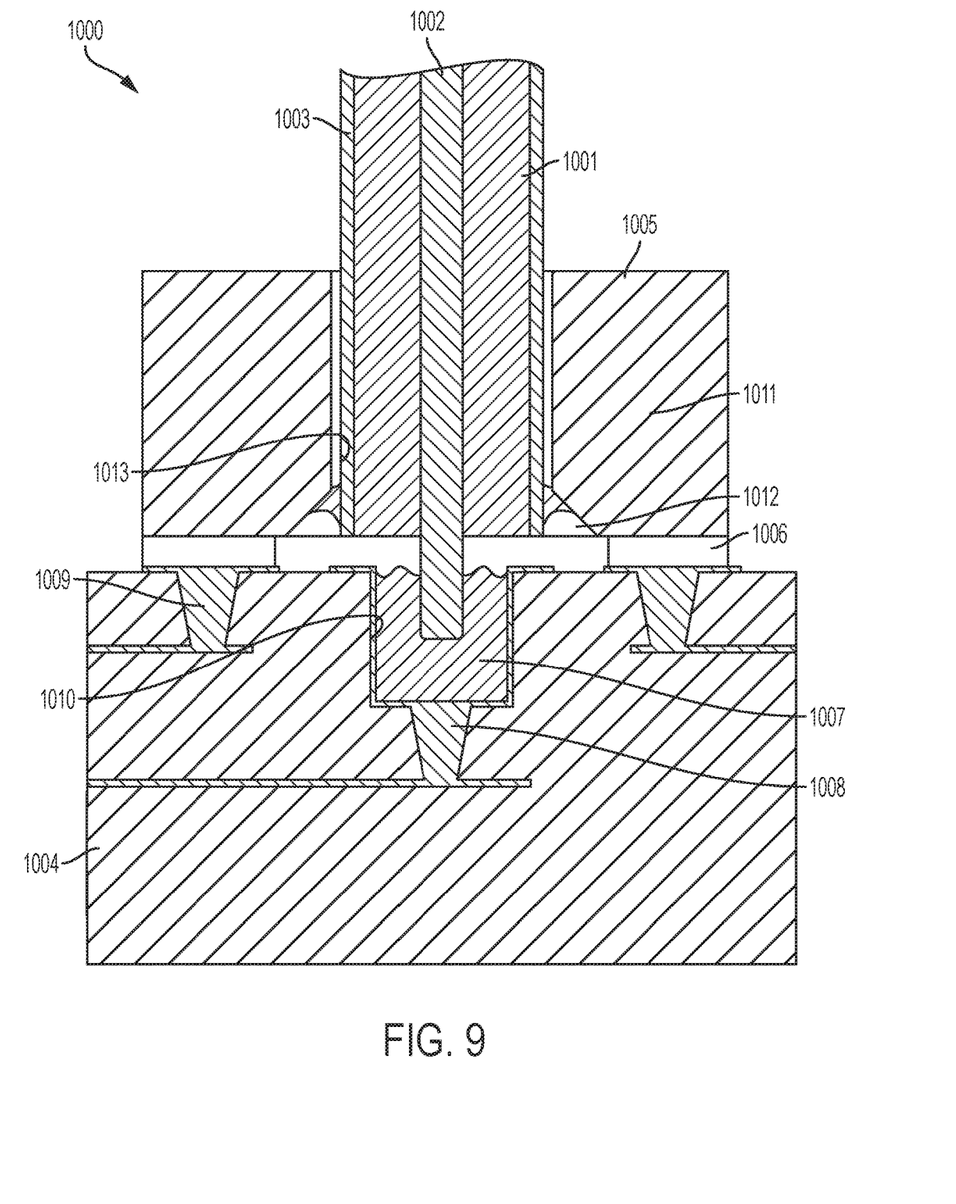
FIG. 9 is a side view of a connectable assembly for use with a coaxial cable in accordance with embodiments.

With reference to FIG. 9, a connectable assembly 1000 is provided for a male conductive element, such as a coaxial cable 1001 having an inner conductor 1002 or simply the inner conductor 1002, an outer conductor 1003 and dielectric material disposed between the inner conductor 1002 and the outer conductor 1003. The connectable assembly 1000 includes a first body 1004, a second body 1005, an interposer element 1006 and a CC plug 1007. The first body 1004 includes first circuitry 1008 (e.g., internal circuit trace elements and vias) and second circuitry 1009 (e.g., internal circuit trace elements, surface trace elements and vias) and is formed to define a recess 1010 that is similar to the recess 34 described above. The second body 1005 includes electrically conductive elements, such as a coaxial cable mounting element 1011 and a compliant conductor 1012. The compliant conductor 1012 is electrically connected to the coaxial cable mounting element 1011 and both the coaxial cable mounting element 1011 and the compliant conductor 1012 are formed of conductive materials. In accordance with embodiments, at least the compliant conductor 1012 may be formed of conductive polymer, conductive metal or conductive plastic. In any case, the second body 1005 is formed to define a first through-hole 1013. The first through-hole 1013 is receptive of the coaxial cable 1001 such that the compliant conductor 1012 electrically connects with the outer conductor 1003.

The interposer element 1006 may be provided as an RF gasket that is formed of electrically conductive material and is axially interposable between the first and second bodies 1004 and 1005 (in the embodiment of FIG. 9, the illustration of the interposer element 1006 shows an interior sidewall or surface of the interposer element 1006 but it is to be understood that this interior sidewall or surface is not in contact with the inner conductor 1002). The interposer element 1006 thus forms an electrically conductive pathway from the coaxial cable mounting element 1011 to surface trace elements of the second circuitry 1009. The CC plug 1007 is disposable within the recess 1010 to electrically connect with the first circuitry 1008 and is configured for establishing a radially compliant, axially free running electrical connection with the inner conductor 1002.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A connectable assembly, comprising:
    a body having an outer surface and defining a recess comprising an axial end wall and a sidewall extending from the axial end wall to the outer surface; and
    a conductive compliant (CC) plug disposed within the recess to abut with a length of the sidewall extending toward the outer surface from a location at or proximate to the axial end wall,
    the CC plug being configured for establishing a radially compliant, axially free running electrical connection with a male conductive element.

2. The connectable assembly according to claim 1, wherein the male conductive element comprises a pin connector.

3. A method of assembling, disassembling and re-assembling of the connectable assembly according to claim 1, the method comprising:
    inserting the male conductive element into the CC plug to establish the radially compliant, axially free running electrical connection;
    withdrawing the male conductive element from the CC plug; and
    re-inserting the male conductive element into the CC plug to re-establish the radially compliant, axially free running electrical connection.

4. The connectable assembly according to claim 1, wherein the body comprises first and second bodies and further comprising an intermediate carrier interposed between the first and second bodies.

5. The connectable assembly according to claim 1, wherein the male conductive element comprises a coaxial cable.

6. The connectable assembly according to claim 2, further comprising a first body comprising first circuitry, wherein:
    the body is a second body comprising second circuitry,
    the pin connector is affixed to the first body in electrical connection with the first circuitry, and
    the CC plug is disposed within the recess in electrical connection with the second circuitry for establishing the radially compliant, axially free running electrical connection with the pin connector.

7. The connectable assembly according to claim 6, wherein the first and second bodies each comprise a circuit board or at least one of the first and second bodies comprises a chip package.

8. The connectable assembly according to claim 6, wherein the CC plug comprises at least one or more of conductive polymer, foamed metal and foamed plastic.

9. The connectable assembly according to claim 6, wherein:
the second body is formed to define multiple recesses in an array, and
the pin connector and the CC plug are each provided as a plurality of pin connectors and CC plugs in correspondence with the multiple recesses.

10. The connectable assembly according to claim 6, further comprising mounting hardware configured to secure the first and second bodies together.

11. The connectable assembly according to claim 10, further comprising spacers interposed between the first and second bodies.

12. The connectable assembly according to claim 6, wherein the pin connector comprises a pin configured for insertion into the CC plug.

13. The connectable assembly according to claim 12, wherein the pin has a substantially uniform thickness and the CC plug is formed to define a pin-hole and the pin has a diameter which exceeds a corresponding dimension of the pin-hole.

14. The connectable assembly according to claim 12, wherein the pin is tapered and, with the extension of the pin into the recess, the CC plug forms compressively deformed wings sections extending along sides of the pin.

15. A method of assembling, disassembling and re-assembling of the connectable assembly according to claim 6, the method comprising:
inserting the pin connector into the CC plug to establish the radially compliant, axially free running electrical connection;
withdrawing the pin connector from the CC plug; and
re-inserting the pin connector into the CC plug to re-establish the radially compliant, axially free running electrical connection.

16. The method according to claim 15, wherein the pin connector comprises one of:
a pin having a substantially uniform thickness, wherein the pin the CC plug is formed to define a pin-hole and the pin has a diameter which exceeds a corresponding dimension of the pin-hole; and
a tapered pin, wherein, with the extension of the pin into the recess, the CC plug forms compressively deformed wings sections extending along sides of the pin.

17. The method according to claim 15, wherein the re-inserting comprises one of driving the pin connector into an existing pin-hole in the CC plug and driving the pin connector into the CC plug to form a new pin-hole in the CC plug.

18. The connectable assembly according to claim 4, wherein:
the first body comprises first circuitry and is formed to define the recess as a first recess,
the second body comprises second circuitry and is formed to define the recess as a second recess,
the intermediate carrier is interposable between the first and second bodies and comprises first and second sides and first and second pin connectors affixed to the first and second sides, respectively; and
the CC plug comprises first and second CC plugs disposed within the first and second recesses in electrical connection with the first and second circuitry, respectively, for radially compliant, axially free running electrical connections with the first and second pin connectors, respectively.

19. The connectable assembly according to claim 18, wherein the first and second bodies each comprise a circuit board or at least one of the first and second bodies comprises a chip package.

20. The connectable assembly according to claim 18, wherein the CC plug comprises at least one or more of conductive polymer, foamed metal and foamed plastic.

21. The connectable assembly according to claim 18, wherein:
the first and second bodies are each formed to define multiple first and second recesses in respective arrays, and
the first and second pin connectors and the first and second CC plugs are each provided as pluralities of first and second pin connectors and first and second CC plugs in correspondence with the multiple first and second recesses.

22. The connectable assembly according to claim 21, wherein the first and second pin connectors each comprise a pin configured for insertion into the CC plugs.

23. The connectable assembly according to claim 22, wherein the pins of each of the first and second pin connectors have a substantially uniform thickness and the CC plugs are each formed to define a pin-hole or are tapered.

24. A connectable assembly, comprising:
a body defining a recess;
a male conductive element comprising a coaxial cable supportively disposed proximate to the body; and
a conductive compliant (CC) plug disposed within the recess for establishing a radially compliant, axially free running electrical connection with the male conductive element comprising the coaxial cable, wherein the coaxial cable has inner and outer conductors and the body is a first body comprising first and second circuitry and further comprising:
a second body comprising electrically conductive elements and defining a first through-hole receptive of the coaxial cable such that the electrically conductive elements electrically connect with the outer conductor; and
an interposer element interposable between the first and second bodies to form an electrically conductive pathway from the electrically conductive elements to the second circuitry,
the CC plug being disposable within the recess in electrical connection with the first circuitry for establishing a radially compliant, axially free running electrical connection with the inner conductor.

25. The connectable assembly according to claim 24, wherein the electrically conductive elements and the CC plug comprise at least one or more of conductive polymer, foamed metal and foamed plastic.

26. A connectable assembly, comprising:
a body having an outer surface and defining a recess comprising an axial end wall and a sidewall extending from the axial end wall to the outer surface;
a male conductive element supportively disposed proximate to the body and having a length extendible into the recess; and a conductive compliant (CC) plug disposed within the recess to abut with a length of the sidewall extending toward the outer surface from a location at or proximate to the axial end wall, the CC plug being configured to deform radially without failure or axial compression during an extension of the length of the male conductive element into the recess for establishing a radially compliant, axially free running electrical connection with at least a portion of the length of the male conductive element defined along a corresponding portion of the length of the sidewall.

* * * * *